(12) United States Patent
Venkata et al.

(10) Patent No.: US 6,888,376 B1
(45) Date of Patent: May 3, 2005

(54) MULTIPLE DATA RATES IN PROGRAMMABLE LOGIC DEVICE SERIAL INTERFACE

(75) Inventors: Ramanand Venkata, San Jose, CA (US); Chong H. Lee, San Ramon, CA (US); Rakesh Patel, Cupertino, CA (US)

(73) Assignee: Altera Corporation, San Jose, CA (US)

(*) Notice: Subject to any disclaimer, the term of this patent is extended or adjusted under 35 U.S.C. 154(b) by 51 days.

(21) Appl. No.: 10/670,845

(22) Filed: Sep. 24, 2003

(51) Int. Cl.[7] .......................................... H03K 19/177
(52) U.S. Cl. ........................... 326/41; 326/47; 326/37; 370/445
(58) Field of Search .................. 326/37–41, 47

(56) References Cited

U.S. PATENT DOCUMENTS

| | | | |
|---|---|---|---|
| 3,473,160 A | 10/1969 | Wahlstrom | 326/41 |
| 4,486,739 A | 12/1984 | Franaszek et al. | 341/59 |
| 5,689,195 A | 11/1997 | Cliff et al. | 326/41 |
| 5,802,103 A | 9/1998 | Jeong | 375/220 |
| 5,909,126 A | 6/1999 | Cliff et al. | 326/41 |
| 6,031,428 A | 2/2000 | Hill | 331/11 |
| 6,215,326 B1 | 4/2001 | Jefferson et al. | 326/41 |
| 6,240,471 B1 | 5/2001 | Schlueter et al. | 710/62 |
| 6,270,350 B1 | 8/2001 | Christopher | 434/69 |
| 6,370,603 B1 | 4/2002 | Silverman et al. | 710/72 |
| 6,388,591 B1 | 5/2002 | Ng | 341/100 |
| 6,407,576 B1 | 6/2002 | Ngai et al. | 326/41 |
| 6,617,877 B1 * | 9/2003 | Cory et al. | 326/41 |
| 6,650,140 B2 * | 11/2003 | Lee et al. | 326/39 |
| 6,750,675 B2 * | 6/2004 | Venkata et al. | 326/41 |
| 2001/0033188 A1 | 10/2001 | Aung et al. | 327/41 |
| 2002/0190751 A1 | 12/2002 | Lee et al. | 326/39 |
| 2003/0052709 A1 | 3/2003 | Venkata et al. | 326/37 |
| 2003/0155955 A1 | 8/2003 | Andrasic et al. | 327/277 |

OTHER PUBLICATIONS

Agere Systems, Inc., "ORCA ORT82G5 1.0–1.25/2.0–2.5/3.125 Gbits/s Backplane Interface FPSC," Preliminary Data Sheet, pp. 1–35 (Jul. 2001).

Agere Systems, Inc., "ORCA ORT8850 Field–Programmable System Chip (FPSC) Eight Channel x 850 Mbits/s Backplane Transciever," Product Brief, pp. 1–6 (Jul. 2001).

Agere Systems, Inc., "ORCA ORT8850 Field–Programmable System Chip (FPSC) Eight Channel x 850 Mbits/s Backplane Transciever," Product Brief, pp. 1–36 (Aug. 2001).

Cook, Barry M., "IEEE 1355 Data–Strobe Links: ATM Speed at RS232 Cost," *Microprocessors and Microsystems*, vol. 21, No. 7–8, pp. 421–428 (Mar. 30, 1998).

(Continued)

*Primary Examiner*—Vibol Tan
(74) *Attorney, Agent, or Firm*—Fish & Neave IP Group of Ropes & Gray LLP; Jeffrey H. Ingerman

(57) ABSTRACT

A serial interface for a programmable logic device supports a higher physical medium attachment ("PMA") data rate than the available physical coding sublayer ("PCS") data rate by using multiple PCS modules, operating in parallel, to support one PMA module. In a channel-based structure, the PMA module is supported by a PCS module in its own channel and at least one PCS module from a second channel. The second channel may include its own PMA module which, if provided, may operate at a lower rate, supportable by the PCS module in that channel. Optionally, two modes are provided. In one mode, two PCS modules in two channels support one higher-speed PMA module in one of the channels. In a second mode, each PCS module supports a PMA module in its own channel, with the higher-speed PMA module constrained to operate at the lower data rate of the PCS module.

38 Claims, 5 Drawing Sheets

OTHER PUBLICATIONS

Electronic Trend Publications, Inc., "Lucent Introduces 10Gb/s Ethernet FPGAs," *Programmable Logic News and Views*, vol. 9, No. 11, pp. 7–8 (Nov. 2000).

Konstas, Jason, "Converting Wide, Parallel Data Buses to High Speed Serial Links," *International IC '99 Conference Proceedings*, pp. 19–30 (1991).

Lemme, Helmuth, "Schnelle Chips Für 'Flaschenhälse'," *Elektonik*, vol. 40, No. 22, pp. 104–109 (Oct. 29, 1991).

Lucent Technologies, Inc., "Protocol Independent Gigabit Backplane Transceiver Using Lucent ORT4622/ORT8850 FPSCs," Application Note, pp. 1–10 (Jun. 2000).

Lucent Technologies, Inc., "ORCA ORT82G5 0.622/1.0–1.25/2.0–2.5/3.125 Gbits/s Backplane Interface FPSC," Product Brief, pp. 1–8 (Feb. 2001).

Xilinx, Inc., *Virtex–II Pro Platform FPGA Handbook* (UG012 Version 1.0), pp. 1–6, 27–32, 121–126, and 162–180 (Jan. 31, 2002).

Xilinx, Inc., Rocket I/O Transceiver User Guide (UG024 Version 1.2), pp. 1–106 (Feb. 25, 2002).

* cited by examiner

MULTIPLE DATA RATES IN PROGRAMMABLE LOGIC DEVICE SERIAL INTERFACE

BACKGROUND OF THE INVENTION

This invention relates to a high-speed serial interface, especially in a programmable logic device, which may operate at different data rates.

Recently, PLDs have begun to incorporate high-speed serial interfaces to accommodate high-speed (i.e., greater than 1 Gbps) serial I/O standards—e.g., the XAUI (10 Gbps Extended Attachment Unit Interface) standard. In accordance with the XAUI standard, a high-speed serial interface includes transceiver groups known as "quads," each of which includes four transceivers and some central logic.

In one implementation, each transceiver is divided into a physical medium attachment (PMA) portion or module which communicates with outside devices, and a physical coding sublayer (PCS) portion or module which performs serial processing of data, for transmission to, or that is received from, those outside devices. Currently available PMA modules and PCS modules overlap in terms of the data rates that each will support, but the maximum data rate of available PMA modules exceeds the maximum data rate of available PCS modules. Therefore, up to a certain data rate, the PCS module of each channel can support the data rate of the PMA module of that channel. However, beyond that data rate, the currently available PCS module cannot support the data rate of the PMA module.

It would be desirable to be able to support the data rate of currently available PMA technology using currently available PCS technology. It would further be desirable to be able to do so efficiently in a programmable logic context.

SUMMARY OF THE INVENTION

The present invention achieves, in a high-speed serial interface of the type described, in a PLD, data transmission and reception at rates supportable by the PMA portions of the interface, by processing the data in parallel in more than one PCS module per PMA module. For example, using current 130 nm semiconductor technology, a typical maximum PMA data rate is about 6.5 Gbps, while a typical maximum PCS data rate is about 4 Gbps. If each channel were constructed using one PCS module and one PMA module, the PCS data rate would be a limiting factor, constraining the maximum channel data rate to about 4 Gbps. In one preferred embodiment of the invention, two PCS modules are provided for each PMA module. In the transmission direction, the two PCS modules process the outbound data in parallel and their outputs are agglomerated for input to the PMA module. In the reception direction, the outputs of the PMA module are divided for processing by two PCS modules.

For compatibility with existing high-speed serial interface architectures and standards, such an interface preferably is constructed using the same layout as existing high-speed serial interfaces. In a common layout, intended to support at least the aforementioned XAUI standard, a high-speed serial interface has four transceiver channels, as well as a central logic region including a central transmit clock circuit which frequently is a phase-locked loop ("PLL") or delay-locked loop ("DLL"). Each transceiver channel includes one each of the aforementioned PCS and PMA modules. Thus, in one preferred embodiment of the present invention, a high-speed serial interface has a central logic area and four channel areas. In each of two of the channel areas, there are both a PCS module and a PMA module. In each of the other two channel areas, there is a PCS module, but the area normally occupied by the PMA module is unused. The conductors that normally would communicate between the PCS module and the missing PMA module are routed to a PMA module in an adjacent channel, and agglomerated with the conductors of the PCS module in that other channel. Thus, the PMA module of that other channel is serviced by two PCS modules. In the aforementioned 130 nm example, the two PCS modules would operate at up to about 4 Gbps in parallel, supporting operation of the PMA module at up to about 6.5 Gbps (or up to about 8 Gbps if such a PMA module were provided). It is expected that for 90 nm technology, such an arrangement would be about 50% faster, allowing operation at data rates approaching 10 Gbps.

In the embodiment described in the preceding paragraph, the area that would normally be occupied by a PMA module is wasted in two of the four channels of each quad. Therefore, in accordance with a second preferred embodiment of the invention, one or both of the channels that, in the first embodiment, do not include a PMA module, include a PMA module capable of operating at data rates supportable by a single PCS module. Thus, in the 130 nm example, one or both of the channels that do not include a 6.5 Gbps PMA module include a 4 Gbps PMA module. The input/output conductors of the PCS module in the channel that includes the lower-speed PMA module preferably are routed through a selector that selectably connects them either to the higher-speed PMA module of the adjacent channel, or to the lower-speed PMA module of its own channel. The selector, which may be a multiplexer, could be controlled by a configuration bit set by a user in programming the programmable logic device of which the interface is a part, or it could be controlled by logic (normally user-defined) in the programmable logic portion of the programmable logic device.

Such an arrangement preferably supports two modes of operation for each pair of channels. In one mode, in which the selector is programmed to direct the conductors of the PCS module in the channel with the lower-speed PMA module to the neighboring higher-speed PMA module, the pair of channels operates as a single high-speed channel, as do both channels in the first embodiment. In another mode, in which the selector is programmed to directed the conductors of the PCS module in the channel with the lower-speed PMA module to that lower-speed PMA module, then each channel in the pair of channels operates independently at respective maximum rates determined by the respective PMA modules. To support such operation, preferably the central logic area of the interface includes two separate clock sources, one of which generates a clock signal at up to the maximum data rate of the higher-speed PMA module, and one of which generates a clock signal at up to the maximum data rate of the lower speed PMA module. Thus, in the 130 nm example, the central logic area preferably would include a PLL or DLL generating a 6.5 GHZ clock as well as a PLL or DLL generating a 4 GHz clock.

Generally, a PMA module with the higher maximum data rate has a higher minimum data rate as well. Thus, in the mode of operation of the second embodiment in which each pair of channels is operated as two independent channels, those channels may have different minimum data rates as well as different maximum data rates. The operating data rate ranges of the two channels of each pair of channels normally overlap. In the 130 nm example, the faster channel might have an operating range between about 2 Gbps and about 6.5 Gbps, while the slower channel might have a operating range between 0 Gbps (or about 0.2 Gbps) and about 4 Gbps. This means that the interface could be operated as a conventional interface—e.g., under the XAUI standard—at the maximum data rate of the slower channel (e.g., 4 Gbps) and the minimum data rate of the faster channel (e.g., 2 Gbps).

Thus, in accordance with the present invention, there is provided a serial interface for use in a programmable logic device. The serial interface includes a first number of physical medium attachment modules, where at least a portion of the first number of these physical medium attachment modules supports a first maximum physical medium attachment data rate, and a second number of physical coding sublayer modules, where each of the physical coding sublayer modules supports a predetermined maximum physical coding sublayer data rate lower than the first maximum physical medium attachment data rate. A respective plurality of the physical coding sublayer modules is connected to each of the physical medium attachment modules that supports the first maximum physical medium attachment data rate. Each such plurality of physical coding sublayer modules supports each physical medium attachment module at a data rate exceeding the predetermined maximum physical coding sublayer data rate up to the first maximum physical medium attachment data rate.

A programmable logic device incorporating such an interface is also provided.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

As described above, the present invention provides a high-speed serial interface that uses parallel processing to achieve higher speeds than would otherwise be attainable. By using at least two PCS modules for each of at least one PMA module, the present invention provides at least one channel whose data rate is limited only by the PMA module, rather than by either PCS module. At the same time, the interface can be operated like previously known interfaces—e.g., in accordance with the XAUI standard.

The invention will now be described with reference to FIGS. 1–5.

Figure 1:
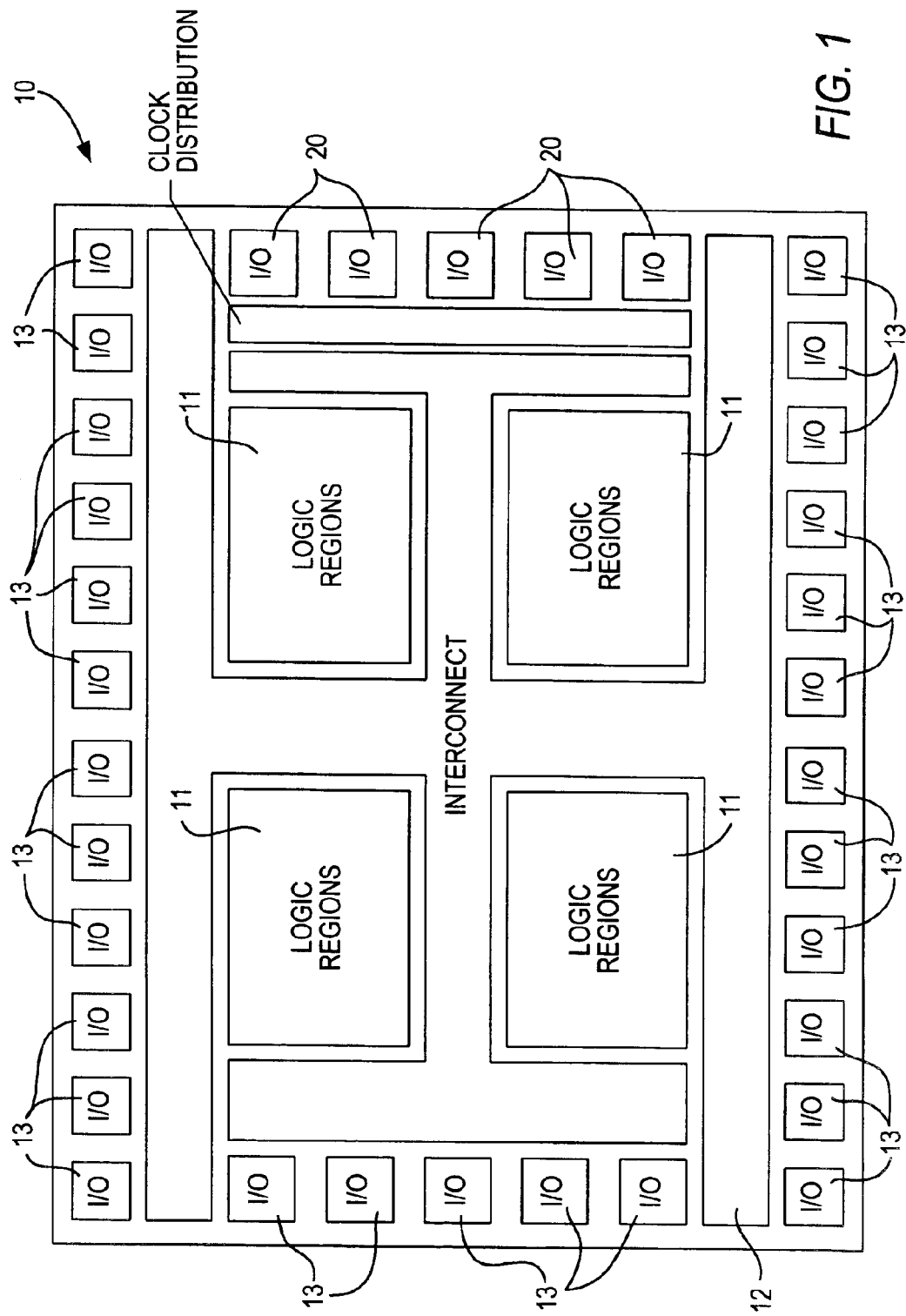
FIG. 1 is a block diagram of a preferred embodiment of a programmable logic device in which the resent invention can be used.

PLD 10, shown schematically in FIG. 1, is one example of a device incorporating a serial interface 20 according to the invention. PLD 10 has a programmable logic core including programmable logic regions 11 accessible to programmable interconnect structure 12. The layout of regions 11 and interconnect structure 12 as shown in FIG. 1 is intended to be schematic only, as many actual arrangements are known to, or may be created by, those of ordinary skill in the art.

Figure 2:
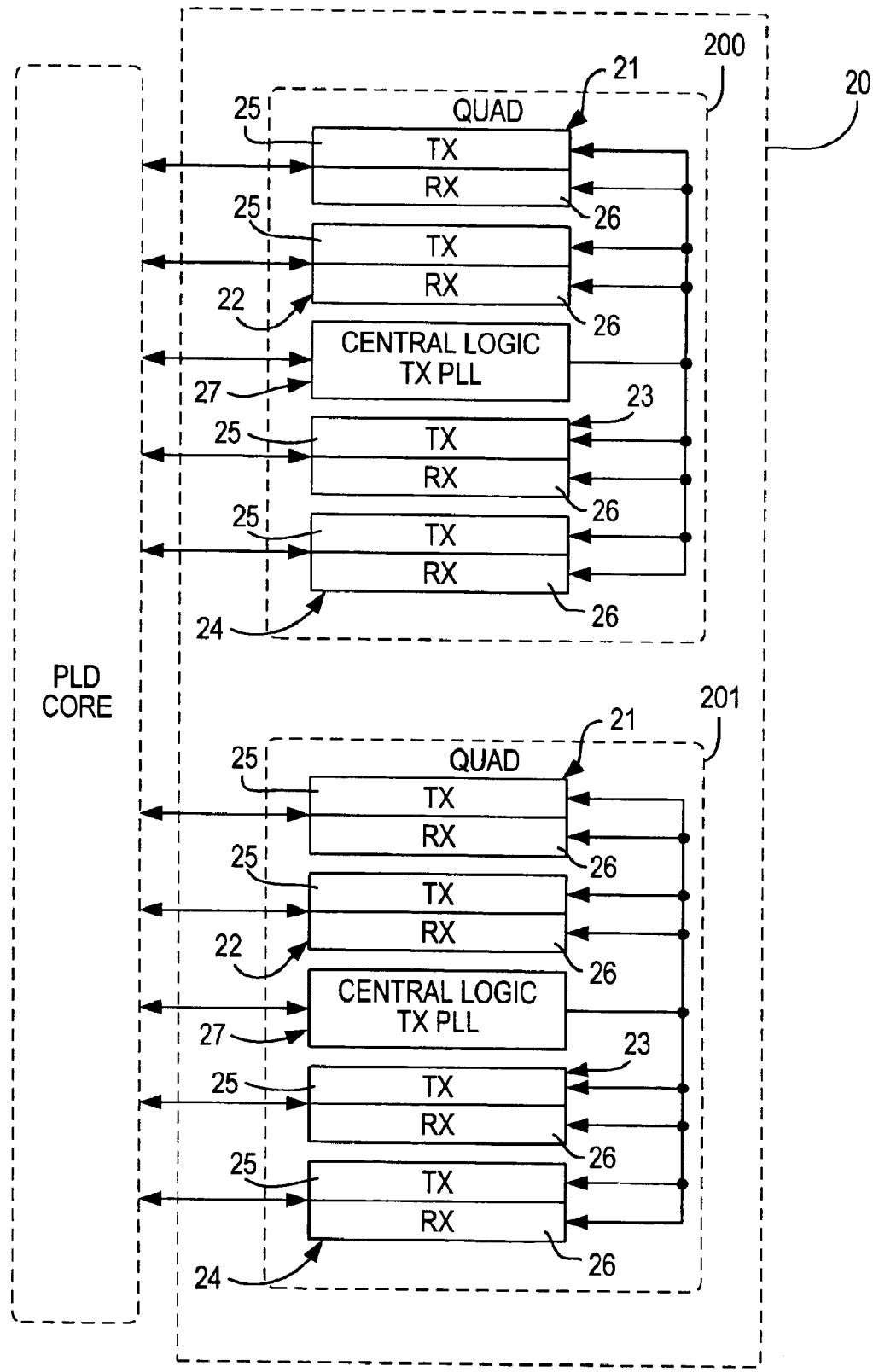
FIG. 2 is a schematic diagram of a serial interface in which the present invention can be used.

PLD 10 also includes a plurality of other input/output ("I/O") regions 13. I/O regions 13 preferably are programmable, allowing the selection of one of a number of possible I/O signaling schemes, which may include differential and/or non-differential signaling schemes. Alternatively, I/O regions 13 may be fixed, each allowing only a particular signaling scheme. In some embodiments, a number of different types of fixed I/O regions 13 may be provided, so that while an individual region 13 does not allow a selection of signaling schemes, nevertheless PLD 10 as a whole does allow such a selection. For example, each I/O region 20 preferably is a high-speed serial interface as described above, similar to an interface capable of implementing the XAUI standard. Thus, as shown in FIG. 2, each interface 20 preferably includes one or more groupings 200, 201 having four channels 21–24, each including a transmitter 25 and a receiver 26, as well as central logic 27. As discussed above, because each such grouping includes four channels, it may be referred to as a "quad." However, it should be understood that in accordance with the present invention, which is not linked to any particular high-speed serial standard, each grouping 200, 201 can include any number of channels greater than or equal to two, although preferably the number of channels is an even number. Similarly, while each region 20 is shown to contain two groupings 200, 201, each region 20 may contain any number of groupings 200, 201.

As shown in FIG. 1, PLD 10 includes five interfaces 20. However, PLD 10 may include any desired number of interfaces 20, with a corresponding number of channels.

Within each interface 20, all transmitters 25 and receivers 26 preferably are substantially similar to known high-speed serial interface transmitters and receivers such as those used with the XAUI standard. It further should be noted that any differences between transmitter 25 or receiver 26 and known high-speed serial transmitters and receivers preferably maintain compatibility with existing standards such as the XAUI standard, while adding capabilities as described herein.

Figure 3:
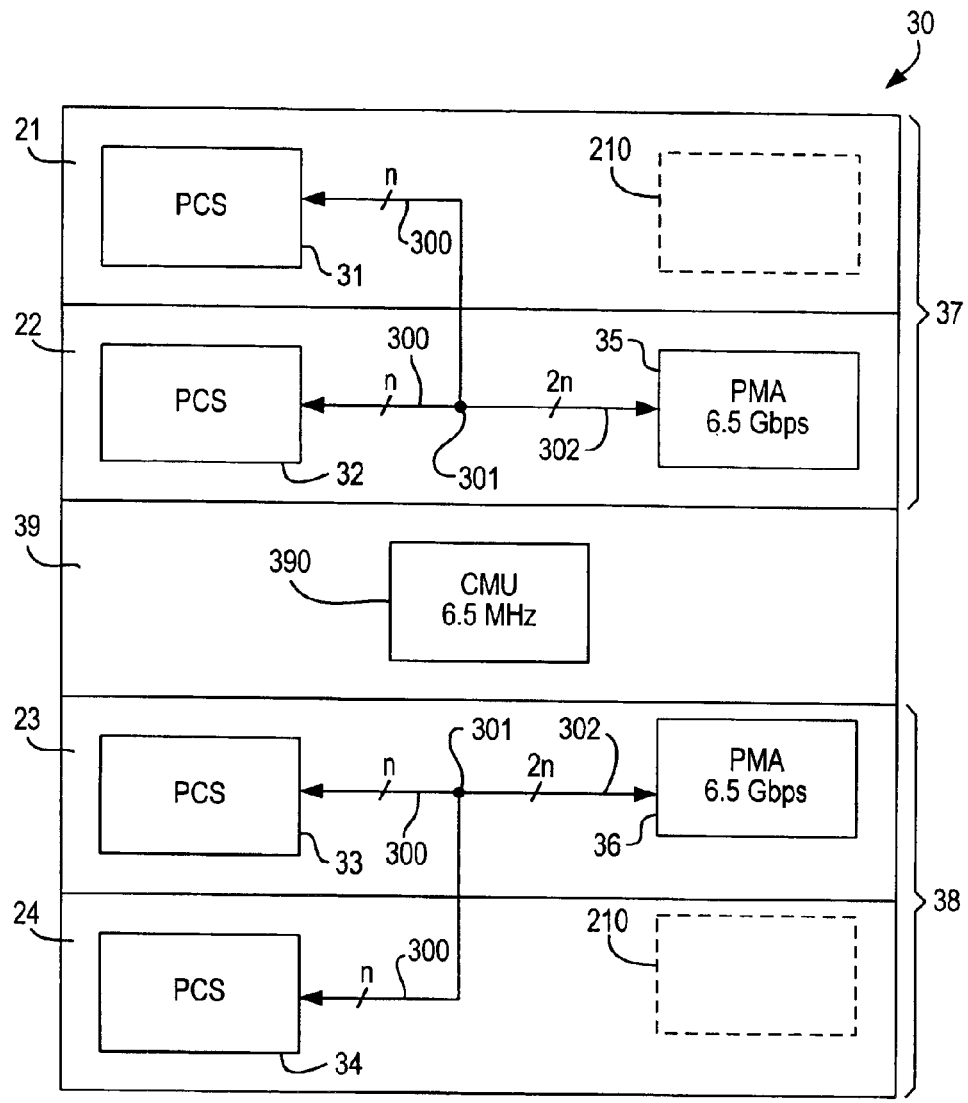
FIG. 3 is a schematic diagram showing detail of one quad of a first preferred embodiment of the interface of FIG. 2.

FIG. 3 shows schematically a first preferred embodiment 30 of a single grouping 200 (or 201). Preferably, and as shown, grouping 200 (or 201) is a grouping of four channel areas 21–24, although any number of channels can be used. However, to gain the maximum advantage of the present invention, the number of channel areas should be even. Otherwise, there will be a channel area that cannot be paired with another channel area in the manner described above to achieve a higher data rate.

Grouping 30 preferably is designed for operation at a nominal maximum data rate of about 6.5 Gbps (and a nominal minimum data rate of about 2 Gbps) using 130 nm technology. The same arrangement using 90 nm technology would be expected to operate about 50% faster, at about 9.75 Gbps. The remaining discussion of FIGS. 3 and 4 will assume 130 nm technology, but it should be kept in mind that other maximum data rates obtain using different technologies. In grouping 30, each of channel areas 21–24 preferably includes a PCS module 31–34 capable of operating at a nominal maximum data rate of about 4 Gbps (and a nominal minimum data rate of about 0.2 Gbps). However, preferably only channel areas 22 and 23 include PMA modules 35, 36, with nominal maximum data rates of about 6.5 Gbps (and nominal minimum data rates of about 2 Gbps). In channel areas 21, 24, the areas 210, 240 that would be occupied by PMA modules are unused.

PCS modules 31, 32, preferably operating at about 4 Gbps, but in parallel, support PMA module 35, preferably operating at about 6.5 Gbps. Similarly, at the same time, PCS modules 33, 34, preferably operating at about 4 Gbps, but in parallel, support PMA module 36, preferably operating at about 6.5 Gbps. The n input/output conductors 300 of each pair of PCS modules 31/32 or 33/34 preferably are agglomerated at points 301 to present 2n conductors 302 to each PMA module 35, 36. Thus, channel areas 21–24 provide two 6.5 Gbps channels 37, 38. Grouping (quad) 30 preferably also includes central logic area 39 preferably including clock management unit 390, which in turn preferably includes a 6.5 MHz clock source (e.g., a PLL or DLL).

Figure 4:
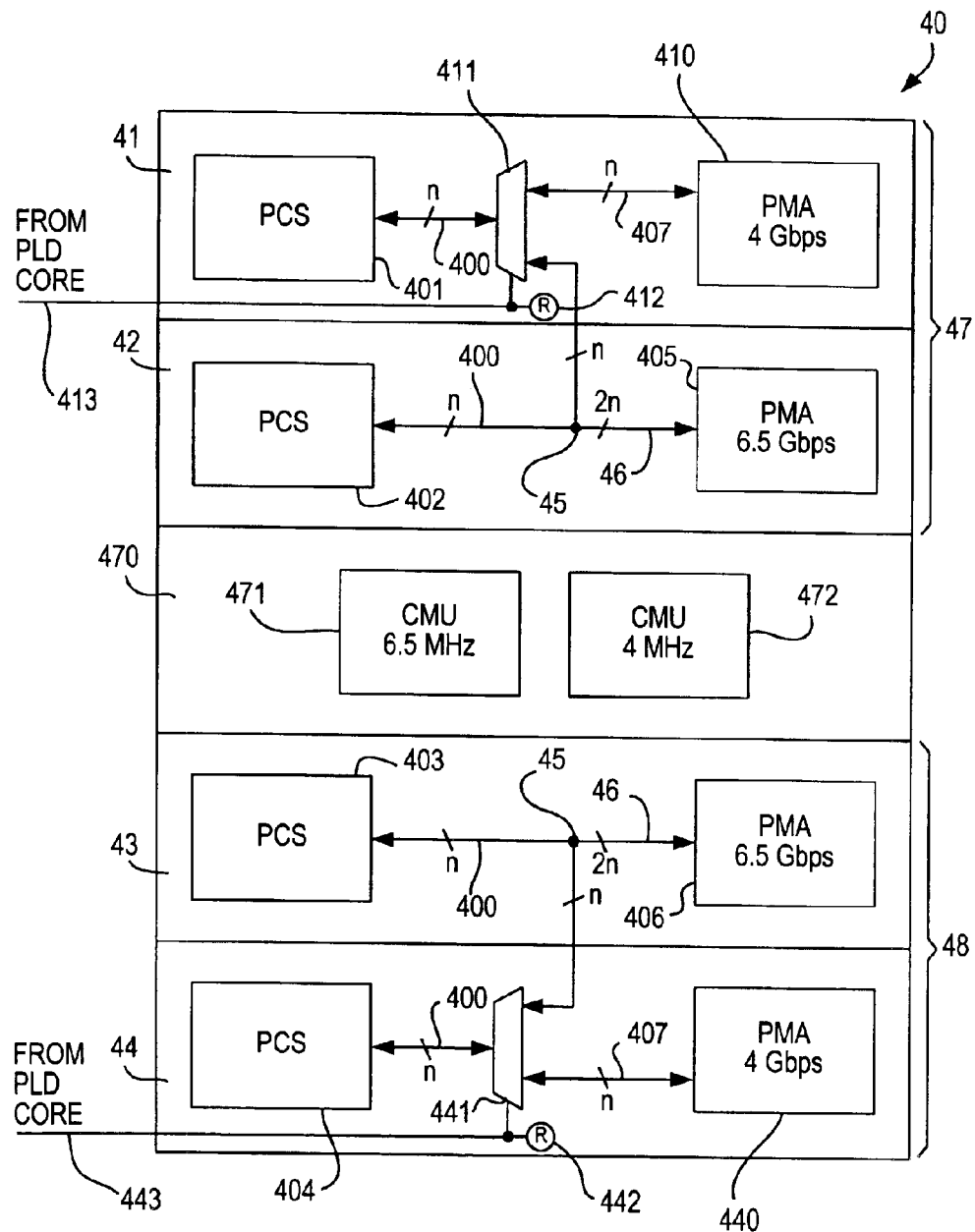
FIG. 4 is a schematic diagram showing detail of one quad of a second preferred embodiment of the interface of FIG. 2.
Figure 5:
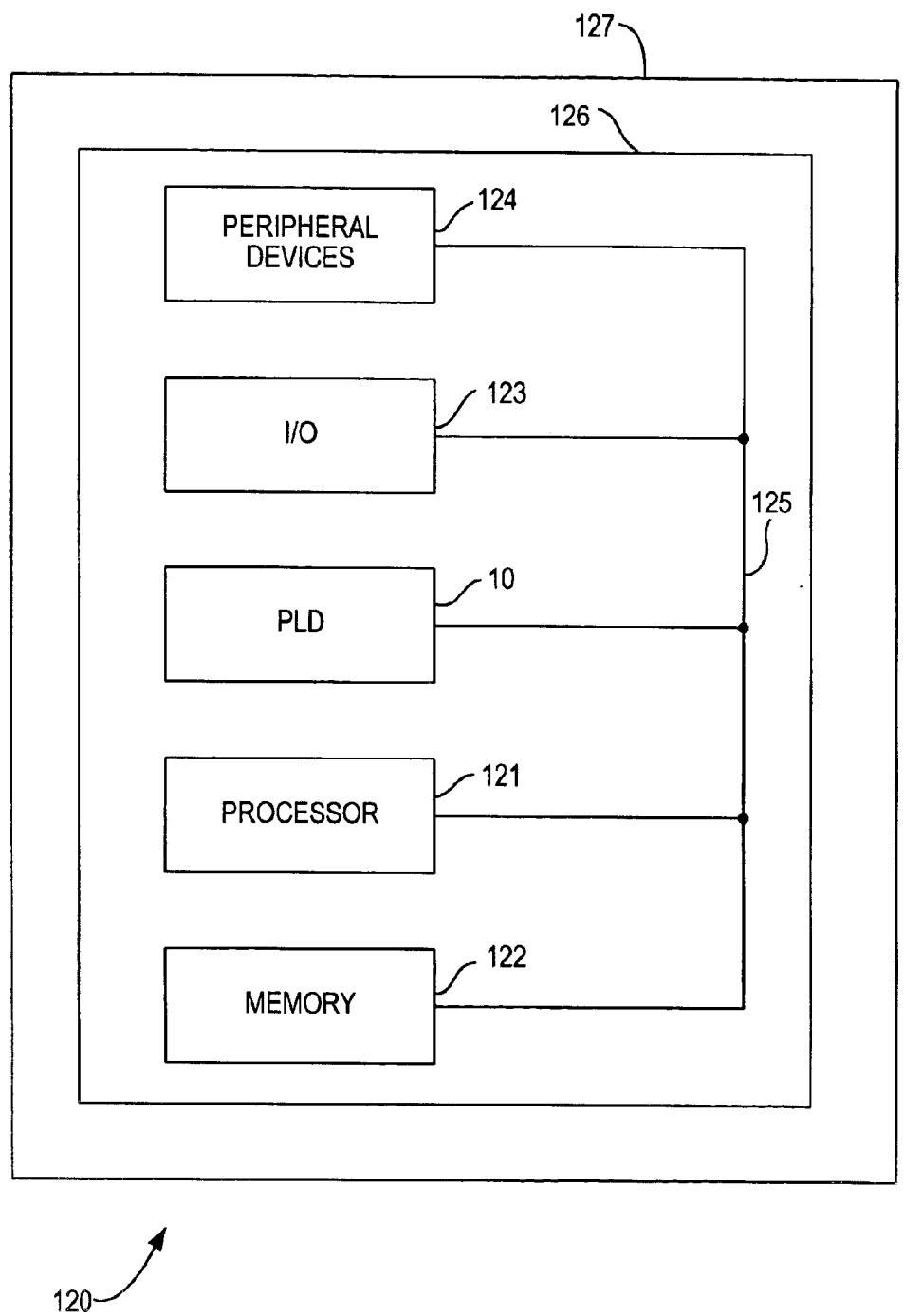
FIG. 5 is a simplified block diagram of an illustrative system employing a programmable logic device incorporating a serial interface in accordance with the present invention.

In grouping 30 of FIG. 3, areas 210, 240 of channels 21, 24 are wasted to provide 6.5 Gbps capability. However, for some applications, the slower 4 Gbps data rate is sufficient. That is particularly so where the application requires use of the XAUI standard. Grouping 30 could not function as a XAUI quad, and at best, if at all, a XAUI quad could be constructed from two groupings 30, using twice the area of a conventional XAUI quad, and where each channel is capable of operating at 6.5 Gbps capability, but is operated at only 4 Gbps. A second preferred embodiment of a grouping 40 according to this invention, which is more efficient in that regard, is shown in FIG. 4.

Grouping 40 can be operated as two 6.5 Gbps channels, or as a conventional quad of four 4 Gbps channels compatible with, e.g., the XAUI standard. Like grouping 30, grouping 40 has four channel areas 41–44, each having 4 Gbps PCS module 401–404. Like channel areas 22 and 23, channel areas 42, 43 include 6.5 Gbps PMA modules 405, 406. And as in grouping 30, PCS modules 401, 402, preferably operating at about 4 Gbps, but in parallel, support PMA module 405, preferably operating at about 6.5 Gbps, while PCS modules 403, 404, preferably operating at about 4 Gbps, but in parallel, support PMA module 406, preferably operating at about 6.5 Gbps. The n input/output conductors 400 of each pair of PCS modules 401/402 or 403/404 preferably are agglomerated at points 45 to present 2n conductors 46 to each PMA module 405, 406.

Thus, like grouping 30, grouping 40 uses four channel areas 41–44 to provide two 6.5 Gbps channels 47, 48. However, unlike grouping 30, grouping 40 can also provide four 4 Gbps channels 41–44. This capability is available because where each of channel areas 21, 24 has an empty area 210, 240, each of channel areas 41, 44 has a 4 Gbps PMA module 410, 440. A respective multiplexer 411, 441 allows the n conductors of respective PCS module 401, 404 to be routed either (a) to respective point 45 where they are agglomerated with the n conductors of respective PCS modules 402, 403 for two-channel operation, or (b) via respective sets of n conductors 407 to respective PMA modules 410, 440 for four-channel operation. Multiplexers 411, 441 preferably are controlled either by optional configuration bits 412, 442 set by a user during PLD programming, or by signals on optional conductors 413, 443 generated in user logic in the PLD core.

In two-channel operation, grouping 40 preferably operates like grouping 30, with two channels 47, 48 having maximum data rates of about 6.5 Gbps, and with PMA modules 410, 440 remaining unused. In four-channel operation grouping 40 can operate in different modes, depending on the desired application. In one mode, channels 42 and 43 operate at data rates up to about 6.5 Gbps while channels 41 and 44 operate at data rates up to about 4 Gbps. In another mode, which is compatible, e.g., with the XAUI standard, all four channels 41–44 operate at the same data rate. In this mode, which is like a conventional high-speed serial interface quad, the maximum possible data rate is that of the slower channels 41 and 44, or about 4 Gbps, with PMA modules 405, 406 operating below their respective nominal maximum data rates of about 6.5 Gbps.

To support two different maximum data rates, central logic area 470 preferably includes two clock management units 471, 472, one of which (unit 471) supplies the 6.5 GHz clock and the other of which (unit 472) supplies the 4 GHz clock. In certain cases, where one of the two data rates is a multiple of the other, it may be possible to rely on a single CMU. However, in the general case two CMUs 471, 472 will be required.

As stated above, all discussion herein of particular data rates is exemplary only and does not limit the present invention, which can be implemented with other combinations of data rates than those discussed herein.

A PLD 10 incorporating interfaces 20 according to the present invention may be used in many kinds of electronic devices. One possible use is in a data processing system 120 shown in FIG. 5. Data processing system 120 may include one or more of the following components: a processor 121; memory 122; I/O circuitry 123; and peripheral devices 1244. These components are coupled together by a system bus 125 and are populated on a circuit board 126 which is contained in an end-user system 127.

System 120 can be used in a wide variety of applications, such as computer networking, data networking, instrumentation, video processing, digital signal processing, or any other application where the advantage of using programmable or reprogrammable logic is desirable. PLD 10 can be used to perform a variety of different logic functions. For example, PLD 10 can be configured as a processor or controller that works in cooperation with processor 121. PLD 10 may also be used as an arbiter for arbitrating access to a shared resources in system 120. In yet another example, PLD 10 can be configured as an interface between processor 121 and one of the other components in system 120. It should be noted that system 120 is only exemplary, and that the true scope and spirit of the invention should be indicated by the following claims.

Various technologies can be used to implement PLDs 10 as described above and incorporating this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A serial interface for use in a programmable logic device, said serial interface comprising:
    a first number of physical medium attachment modules, at least a portion of said first number of said physical medium attachment modules supporting a first maximum physical medium attachment data rate; and
    a second number of physical coding sublayer modules, each of said physical coding sublayer modules supporting a predetermined maximum physical coding sublayer data rate lower than said first maximum physical medium attachment data rate; wherein:

a respective plurality of said physical coding sublayer modules is connected to each of said physical medium attachment modules that supports said first maximum physical medium attachment data rate;

whereby:

each said plurality of said physical coding sublayer modules supports each said physical medium attachment module at a data rate exceeding said predetermined maximum physical coding sublayer data rate up to said first maximum physical medium attachment data rate.

2. The serial interface of claim 1 wherein:

said interface is arranged as a plurality of channels, each of said channels including one of said physical coding sublayer modules and having a location for one of said physical medium attachment modules;

each respective plurality of physical coding sublayer modules includes physical coding sublayer modules from a respective group of multiple channels;

at least one channel in each said respective group of multiple channels includes a physical medium attachment module in said location; and each respective plurality of physical coding sublayer modules is connected to a physical medium attachment module in one channel of its respective group of multiple channels.

3. The serial interface of claim 2 wherein:

at least one channel in at least one of said respective groups of multiple channels includes in said location a physical medium attachment module that supports a second maximum physical medium attachment data rate lower than said first maximum physical medium attachment data rate; and said serial interface further comprises a selector for selectably connecting the physical coding sublayer module in said at least one channel to one of (a) said physical medium attachment module that supports said first maximum physical medium attachment data rate, and (b) said physical medium attachment module that supports said second maximum physical medium attachment data rate; whereby:

said at least one of said respective groups of multiple channels is selectably operable as one of (a) one channel at said first maximum physical medium attachment data rate, and (b) a plurality of channels at said second maximum physical medium attachment data rate.

4. The serial interface of claim 3 wherein said selector is controllable by user programming of said programmable logic device.

5. The serial interface of claim 3 wherein said selector is controllable by logic in said programmable logic device.

6. The serial interface of claim 3 wherein said selector is a multiplexer.

7. The serial interface of claim 3 wherein:

said physical medium attachment module that supports said first maximum physical medium attachment data rate also supports a first minimum physical medium attachment data rate; and said physical medium attachment module that supports said second maximum physical medium attachment data rate also supports a second minimum physical medium attachment data rate lower than said first minimum physical medium attachment data rate; whereby:

any channel operated with one of said physical medium attachment modules that supports said first maximum physical medium attachment data rate is limited to operation at a rate above said first minimum physical medium attachment data rate.

8. The serial interface of claim 3 further comprising:

central logic, said central logic including:

a first clock source for generating a first clock signal at said first maximum physical medium attachment data rate for use as a transmit clock by said one channel operating at said first maximum physical medium attachment data rate.

9. The serial interface of claim 8 wherein said central logic further comprises a second clock source for generating a second clock signal at said second maximum physical medium attachment data rate for use as a transmit clock by any channel of said plurality of channels operating at said second maximum physical medium attachment data rate.

10. The serial interface of claim 2 further comprising:

central logic, said central logic including:

a clock source for generating a clock signal at said first maximum physical medium attachment data rate for use as a transmit clock by said one channel operating at said first maximum physical medium attachment data rate.

11. A programmable logic device comprising the serial interface of claim 1.

12. A digital processing system comprising:

processing circuitry;

a memory coupled to said processing circuitry; and a programmable logic device as defined in claim 11 coupled to the processing circuitry and the memory.

13. A printed circuit board on which is mounted a programmable logic device as defined in claim 11.

14. The printed circuit board defined in claim 13 further comprising:

memory circuitry mounted on the printed circuit board and coupled to the programmable logic device.

15. The printed circuit board defined in claim 14 further comprising:

processing circuitry mounted on the printed circuit board and coupled to the memory circuitry.

16. An integrated circuit device comprising the serial interface of claim 1.

17. A digital processing system comprising:

processing circuitry;

a memory coupled to said processing circuitry; and an integrated circuit device as defined in claim 16 coupled to the processing circuitry and the memory.

18. A printed circuit board on which is mounted an integrated circuit device as defined in claim 16.

19. The printed circuit board defined in claim 18 further comprising:

memory circuitry mounted on the printed circuit board and coupled to the integrated circuit device.

20. The printed circuit board defined in claim 19 further comprising:

processing circuitry mounted on the printed circuit board and coupled to the memory circuitry.

21. A serial interface for use in a programmable logic device, said serial interface comprising:

a plurality of groups of two channels, each channel comprising a physical coding sublayer module and a physical medium attachment module; wherein, in each of said groups:

the physical medium attachment module in a first one said channels supports a first maximum physical medium attachment data rate;

the physical medium attachment module in a second one of said channels supports a second maximum physical medium attachment data rate lower than said first physical medium attachment data rate; and each of said physical coding sublayer modules supports a predetermined maximum physical coding sublayer data rate lower than said first maximum physical medium attachment data rate; each of said groups further comprising:

a selector for selectably connecting the physical coding sublayer module in said second one of said channels to one of (a) said physical medium attachment module in said first one of said channels that supports a first maximum physical medium attachment data rate, and (b) said physical medium attachment module in said second one of said channels that supports said second maximum physical medium attachment data rate; whereby:

each of said groups is selectably operable as one of (a) one channel at said first maximum physical medium attachment data rate, and (b) two channels at said second maximum physical medium attachment data rate.

22. The serial interface of claim 21 wherein said selector is controllable by user programming of said programmable logic device.

23. The serial interface of claim 21 wherein said selector is controllable by logic in said programmable logic device.

24. The serial interface of claim 21 wherein said selector is a multiplexer.

25. The serial interface of claim 21 wherein:

said physical medium attachment module that supports said first maximum physical medium attachment data rate also supports a first minimum physical medium attachment data rate; and said physical medium attachment module that supports said second maximum physical medium attachment data rate also supports a second minimum physical medium attachment data rate lower than said first minimum physical medium attachment data rate; whereby:

any channel operated with one of said physical medium attachment modules that supports said first maximum physical medium attachment data rate is limited to operation at a rate above said first minimum physical medium attachment data rate.

26. The serial interface of claim 21 further comprising:

central logic, said central logic including:

a first clock source for generating a first clock signal at said first maximum physical medium attachment data rate for use as a transmit clock by said one channel operating at said first maximum physical medium attachment data rate.

27. The serial interface of claim 26 wherein said central logic further comprises a second clock source for generating a second clock signal at said second maximum physical medium attachment data rate for use as a transmit clock by any channel in any said group of two channels operating at said second maximum physical medium attachment data rate.

28. The serial interface of claim 21 comprising exactly two of said groups of two channels.

29. A programmable logic device comprising the serial interface of claim 21.

30. A digital processing system comprising:

processing circuitry;

a memory coupled to said processing circuitry; and a programmable logic device as defined in claim 29 coupled to the processing circuitry and the memory.

31. A printed circuit board on which is mounted a programmable logic device as defined in claim 29.

32. The printed circuit board defined in claim 31 further comprising:

memory circuitry mounted on the printed circuit board and coupled to the programmable logic device.

33. The printed circuit board defined in claim 32 further comprising:

processing circuitry mounted on the printed circuit board and coupled to the memory circuitry.

34. An integrated circuit device comprising the serial interface of claim 21.

35. A digital processing system comprising:

processing circuitry;

a memory coupled to said processing circuitry; and an integrated circuit device as defined in claim 34 coupled to the processing circuitry and the memory.

36. A printed circuit board on which is mounted an integrated circuit device as defined in claim 34.

37. The printed circuit board defined in claim 36 further comprising:

memory circuitry mounted on the printed circuit board and coupled to the integrated circuit device.

38. The printed circuit board defined in claim 37 further comprising:

processing circuitry mounted on the printed circuit board and coupled to the memory circuitry.

* * * * *